Oct. 13, 1964 R. P. FARNSWORTH 3,153,151

TRANSISTOR CIRCUITS UTILIZING SHUNT-INPUT TUNNEL DIODE TO PROVIDE POSITIVE SWITCHING AND IMPROVE RISE TIME

Filed Nov. 23, 1960 2 Sheets-Sheet 1

INVENTOR
ROBERT P. FARNSWORTH,
BY
Walter J. Adam
ATTORNEY

Oct. 13, 1964 R. P. FARNSWORTH 3,153,151

TRANSISTOR CIRCUITS UTILIZING SHUNT-INPUT TUNNEL DIODE TO PROVIDE POSITIVE SWITCHING AND IMPROVE RISE TIME

Filed Nov. 23, 1960 2 Sheets-Sheet 2

INVENTOR.
ROBERT P. FARNSWORTH,
BY
Walter J. Adam
ATTORNEY 3,153,151

TRANSISTOR CIRCUITS UTILIZING SHUNT-INPUT TUNNEL DIODE TO PROVIDE POSITIVE SWITCHING AND IMPROVE RISE TIME

Robert P. Farnsworth, Los Angeles, Calif., assignor to Hughes Aircraft Company, Culver City, Calif., a corporation of Delaware Filed Nov. 23, 1960, Ser. No. 71,256
2 Claims. (Cl. 307—88.5)

This invention relates to transistor switching circuits and particularly to transistor circuits utilizing tunnel diode biasing arrangements for providing improved switching operation.

Conventionally a power transistor utilized for a switching operation has a biasing resistor coupled to the base through which leakage current $I_{co}$ flows to a source of reference potential. In order to provide a circuit in which the transistor has a stable nonconductive condition, the biasing resistor is required to be relatively small so as to prevent the steady state leakage current from causing base injection into the transistor. However, while obtaining the stability advantages of a biasing resistor having a small value, a substantial amount of power is sacrificed from the driving source when the transistor is biased to a conductive state. Another disadvantage of the conventional transistor switching circuit is that the speed at which the output pulses rise and fall is limited by the rise and fall times of the driving pulses.

It is therefore an object of this invention to provide an improved arrangement for rapidly switching a transistor.

It is a further object of this invention to combine a tunnel diode and a transistor in a circuit so as to provide improved circuit characteristics during switching operation.

It is a still further object of this invention to provide a tunnel diode biasing circuit for a switching transistor so as to develop reliable performance characteristics while utilizing a minimum power from the source of switching signals.

It is another object of this invention to provide a simplified and reliable switching circuit having characteristics of a conventional Schmitt trigger circuit.

The circuit in accordance with this invention includes a switching transistor combined with a biasing arrangement to provide a trigger type switching circuit. The biasing arrangement which functions to remove the reverse direction leakage current from the base of the transistor, includes a negative resistance device such as a tunnel diode coupled between the base and a source of reference potential. The tunnel diode controls the circuit characteristics so as to provide a proper source impedance both when the transistor is conductive or nonconductive. Thus, a low impedance is effectively presented to the leakage current during the off condition so as to provide positive switching, and a high impedance is effectively presented to the switching source during the on condition so that the majority of the current from the source passes into the base of the transistor. Also, because of the negative resistance characteristics of the tunnel diode, the output pulses have fast rise and fall times. When the base of the transistor is controlled by a voltage of varying amplitude rather than switching pulses, the circuits in accordance with this invention are a simplified and improved arrangement providing Schmitt trigger performance characteristics.

The novel features of this invention, as well as the invention itself, both as to its organization and method of operation, will best be understood from the accompanying description taken in connection with the accompanying drawings, in which.

Figures 1, 2, 3, 4, 6:
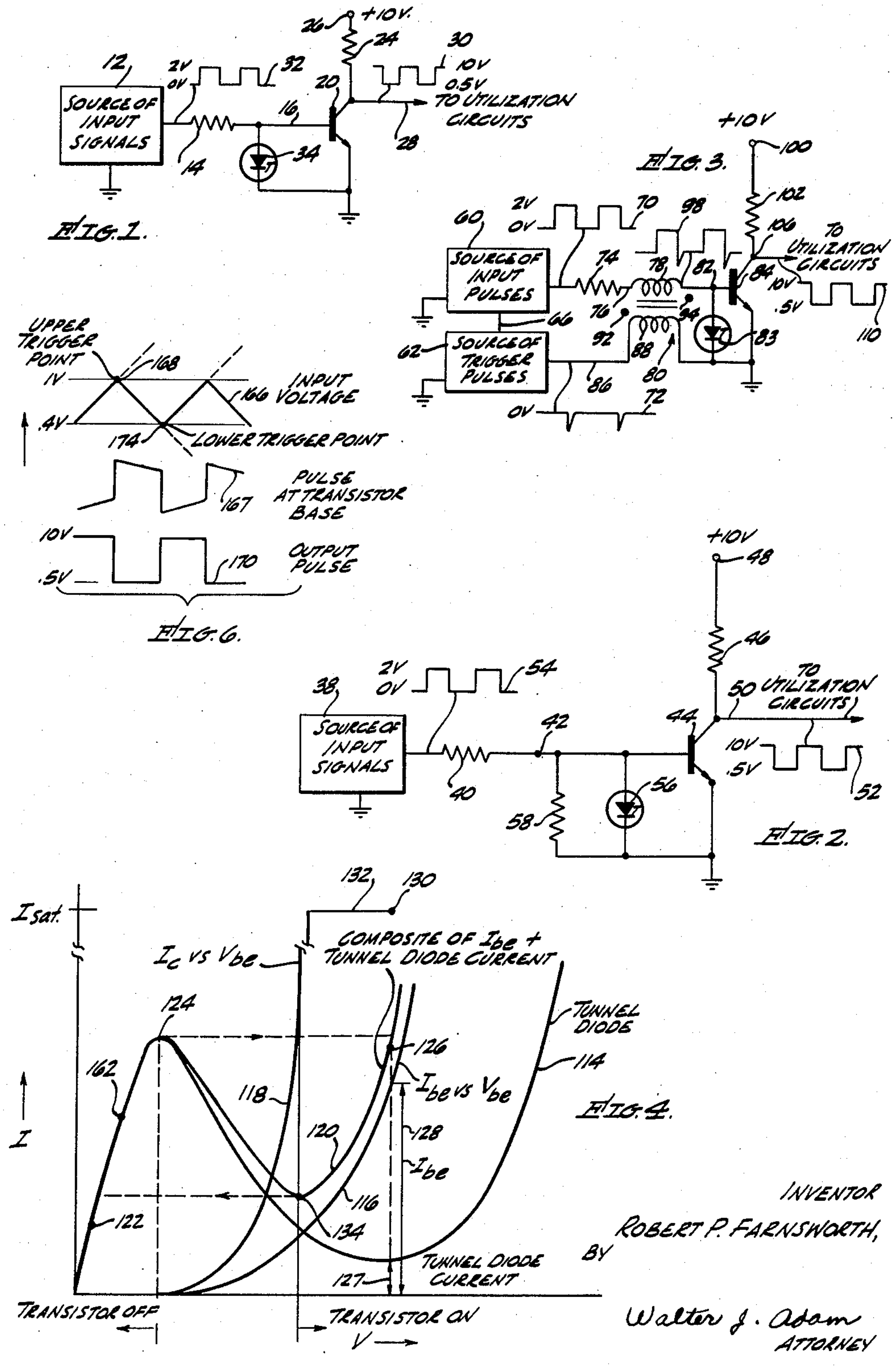
FIG. 1 is a schematic circuit diagram of one arrangement of the transistor switching circuit in accordance with this invention.
FIG. 2 is a schematic circuit diagram of another arrangement of the switching circuit in accordance with this invention providing a large range of transistor leakage current than in the circuit of FIG. 1.
FIG. 3 is a schematic circuit diagram of another arrangement of the switching circuit in accordance with this invention, also providing a larger range of allowable transistor leakage current to the transistor than in the circuit of FIG. 1.
FIG. 4 is a graph of current versus voltage for explaining the operating characteristics of the circuits of FIGS. 1 and 3.
FIG. 6 is a graph of waveforms for explaining the Schmitt trigger operating characteristics of the circuit of FIGS. 1 and 2.

Referring first to the circuit of FIG. 1, an input signal source 12 is coupled through a resistor 14 and a lead 16 to the base of a transistor 20 which may be of the n-p-n type. The resistor 14 may be provided so that the source 12 is essentially a current source. The emitter of the transistor 20 is coupled to ground and the collector is coupled through a signal forming or load element such as resistor 24 to a terminal 26 which, for example, may supply a positive potential of +10 volts relative to ground. The collector of the transistor 20 is also coupled through an output lead 28 to utilization circuits (not shown) to which pulses indicated by negative pulses of a waveform 30 are applied in response to positive input pulses indicated by a waveform 32. To provide substantially constant current biasing to the base of the transistor 20 and to provide improved circuit characteristics, a negative resistance device such as a tunnel diode 34 has an anode coupled to the lead 16 and a cathode coupled to ground. The tunnel diode 34 effectively changes impedance in response to the pulses of the waveform 32 so as to pass the desired transistor leakage current when the transistor 20 is switched to an off or nonconductive condition and to pass a minimum current from the source 12 when the transistor 20 is switched to the on or conductive condition.

Referring now to the circuit of FIG. 2 which allows operation with relatively larger transistor leakage currents than in the circuit of FIG. 1, an input signal source 38 is coupled through a resistor 40 to provided an effective current source and in turn through a lead 42 to the base of a transistor 44 which may be of the n-p-n type. The emitter of the transistor 44 is coupled to ground and the collector is coupled through a signal forming or load element such as a resistor 46 to a terminal 48 which may provide a positive potential of +10 volts. The collector of the transistor 44 is also coupled through output lead 50 to utilization circuits (not shown) so as to apply negative output or load pulses indicated by a waveform 52 thereto in response to positive input pulses on the lead 42 indicated by a waveform 54. In order to provide improved operating characteristics to the transistor 44, a tunnel diode 56 is provided with an anode coupled to the lead 42 and a cathode coupled to ground. To further improve the circuit operating characteristics so as to tolerate increased transistor leakage current, a resistor 58 is coupled between the lead 42 and ground.

A further arrangement in accordance with this invention shown in FIG. 3 and operable with a relatively large leakage current from the transistor, includes both an input pulse source 60 and a trigger pulse source 62 coupled to the source 60 through a lead 66. The source 62 develops negative signals indicated by a waveform 72 in response to the trailing edge of each positive input pulse indicated by a waveform 70. The input signal source 60 is coupled through a resistor 74 for providing an effective source of current and through a lead 76 to one end of a coil 78 of an inductive or transformer element 80. The other end of the coil 78 is coupled through a lead 82 to the base of a transistor 84 which may be of the n-p-n type. The trigger signals developed by the source 62 are applied through a lead 86 to one end of a coil 88 of the transformer 80 and therethrough to ground. The transformer 80 has a polarity relation indicated by dats 92 and 94 such that the negative trigger signal of the waveform 72 is combined with the pulses of the waveform 70 to form pulses on the lead 82 indicated by a waveform 98 having a negative spike at the trailing edge of each pulse. As will be discussed subsequently, this negative spike causes the source 60 to draw momentary reverse current so that the transistor 84 switches to the nonconductive condition in the presence of relatively large leakage current requirements. The collector of the transistor 84 is coupled to a terminal 100, which may be at a potential of +10 volts, through a signal forming or load element such as a resistor 102. The emitter of the transistor 84 is referenced to ground. Also, the collector of the transistor 84 is coupled through an output lead 106 to utilization circuits (not shown) to which is applied negative output pulses indicated by a waveform 110.

For further explaining the switching operation of the circuit of FIG. 1 in accordance with this invention, the graph of FIG. 4 includes a curve 114 showing the operating characteristics of the tunnel diode 34 and a curve 116 showing the operating characteristic of the base current $I_{be}$ versus base-to-emitter voltage $V_{be}$ of the transistor 20. Another curve 118 drawn to the same scale but with a broken portion at higher currents shows the collector current $I_c$ versus base-to-emitter voltage $V_{be}$, which indicates the load current flowing through the resistor 24. Because of the arrangement of the tunnel diode 34 and the transistor 20 in accordance with this invention, the circuit operating characteristics assume that indicated by a composite curve 120 which is a combination of the tunnel diode characteristic curve 114 and the base current versus base-to-emitter voltage of the transistor 20. The curve 120 represents parallel performance of the base-to-emitter of the transistor 20 and the tunnel diode 34 relative to the lead 16. It is to be noted that a valley point 134 of the curve 120 is substantially to the left of the valley point of the curve 114.

When the transistor 20 is biased in a nonconductive state by the lower potential level shown by the waveform 32, the tunnel diode 34 is maintained at a point such as 122 as a result of transistor leakage current which for the arrangement of FIG. 1 is necessarily at a current level below the valley point of the curve 120. The point 122 is on the composite curve 120 which in the region thereof is essentially the same as the tunnel diode curve 114 because the base-to-emitter current of the transistor 20 shown by curve 116 is zero. Upon application of a positive pulse of the waveform 32, the voltage developed across the tunnel diode increases to the peak 124 of the curve 114, which is the point where the incremental rate of change of current relative to voltage equals zero and becomes negative. As a result the operating point of the circuit changes state to a point such as 126 on the curve 120. In the conductive state represented by the point 126 on the composite curve 120, the tunnel diode current indicated by an arrow 127 may be approximately the same as the tunnel diode current at point 122 and the base-to-emitter current of the transistor 20 indicated by an arrow 128 is the majority of the current from the source 12. Thus, during the conductive state of the transistor 20, the tunnel diode 34 effectively develops a high impedance so that only a small part of the current that would pass through a conventional biasing resistor from the source 12 is passed through the tunnel diode 34. While the circuit is operating at the point 126, the collector current of the transistor 20 is at a point 130 along a saturation line 132 and current passing through the resistor 24 develops an amplified negative pulse of the waveform 30. It is to be noted that if the peak of the pulse of the waveform 32 varies, the point 126 moves along the composite curve 120 with a relatively small increase of current through the tunnel diode 34 while the collector current moving along the saturation line 132 remains substantially constant.

At the termination of the pulse of the waveform 32 the point 126 falls along the composite curve 120 to a valley point 134 at which the sum of the incremental rates of change of current with respect to voltage resulting from the nonlinear impedance of the tunnel diode as shown by curve 114 and the nonlinear impedance of the curve 116 equals zero and becomes negative, causing the tunnel diode 34 to change state and the circuit operating point to be triggered to the first point 122. The incremental change of current on the lead 16 is equal to the incremental change of base-to-emitter current of the transistor 20 plus the incremental change of current through the tunnel diode 34. The incremental change in current $\Delta I$ of the input is equal to $dI/dV$ of the transistor 20 times the voltage change at the lead 16 plus $dI/dV$ of the tunnel diode 34 times the voltage change at lead 16. The circuit remains stable in the conductive state as long as the incremental rate of change of current in the input lead 16 is negative with negative incremental voltage such as between points 126 and 134 of the composite curve 120. During switching from points 126 to 134 the transistor base-to-emitter incremental current change is negative and the tunnel diode incremental current change is positive. As the operating point of the circuit falls to valley point 134, the incremental change of tunnel diode current with decreasing voltage becomes equal to the incremental change of transistor base current with decreasing voltage and the incremental change of input current becomes positive, thus causing the tunnel diode 34 to switch to point 122.

Therefore, because the circuit of FIG. 1 only switches to an off condition when the net rate of current change with decreasing voltage is negative, the point 122 representing the reverse direction leakage current $I_{co}$ flowing from the base the transistor 20 must be maintained below the valley point 134. In the switching operation of the circuit of FIG. 1 the combined characteristics of the tunnel diode 34 and the transistor 20 provides an effective low impedance at the point 122 for the transistor leakage current $I_{co}$ when the transistor 20 is nonconductive and provides an effective high impedance to current from the source 12 when the transistor 20 is switched into conduction such as at the point 126, so as to effect a substantial saving of power from the source 12. Also, because of the trigger action of the circuit and because the collector current remains substantially constant along the saturation line 132, the pulses of the waveform 30 have steep leading and trailing edges without being limited by the steepness of the input pulses of the waveform 32.

Figure 5:
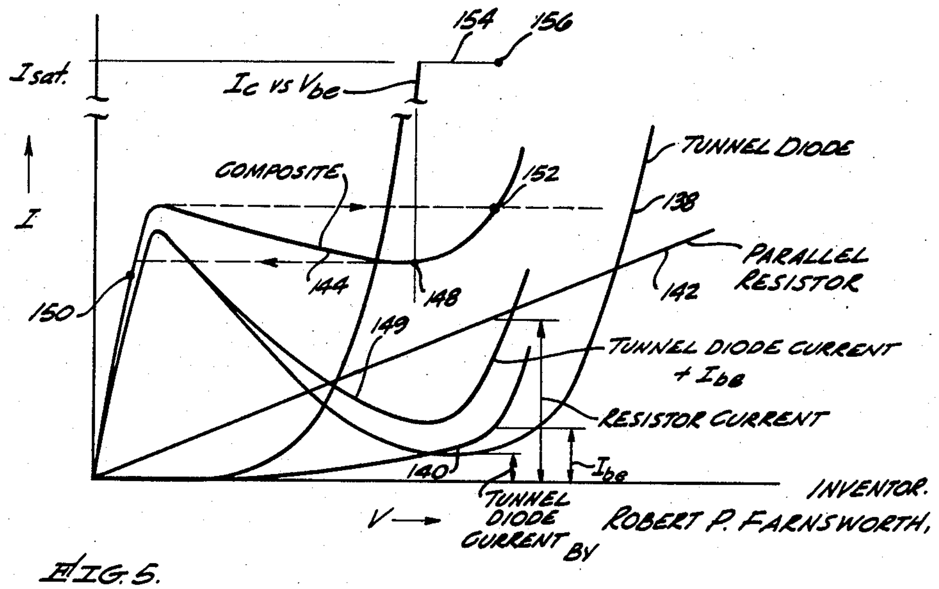
FIG. 5 is a graph of current versus voltage for explaining the operating characteristics of the circuit of FIG. 2.

Because the leakage current in the circuit of FIG. 1 must be maintained below the valley point 134 in order for the transistor 20 to switch to the off or nonconductive condition as discussed above, the arrangement of FIG. 2 is provided to allow the leakage current to be substantially larger such as in high temperature operation. The graph of FIG. 5 shows a curve 138 representing the inherent operating characteristics of the tunnel diode 56, a curve 140 indicating the base current $I_{be}$ versus the base-to-emitter voltage $V_{be}$ of the transistor 44 and a curve 142 indicating the linear current variation through the parallel resistor 58. Because of the circuit arrangement of FIG. 2, the operating characteristic thereof changes so that the circuit characteristic is indicated by a composite curve 144 representing parallel operation relative to the lead 42. The curve 144 which is a composite of the curves 142, 138 and 140 has a valley point 148, which is at a substantially higher current than the valley point of a curve 149 which is a composite of only the tunnel diode current and base-to-emitter current. Thus, in switching operation large leakage current may be tolerated up to the level at the point 148 while allowing switching of the circuit from the conductive to nonconductive state. When the transistor 44 is maintained nonconductive, the tunnel diode may be at a characteristic operating point 150 on the composite curve 144 allowing a relatively large leakage current $I_{co}$ to pass therethrough, and upon application of a positive pulse of the waveform 54 the circuit changes state rapidly to a point 152. At the same time the collector current of the transistor 44 when biased into conduction operates on a saturation line 154 at a point 156 to form the constant current negative output pulse of the waveform 52.

At the termination of the pulse of the waveform 54 the operating point of the circuit falls along the curve 144 to the level of the valley current of the point 148, at which the rate of change of current with respect to voltage is zero, and then returns rapidly to the operating point 150. As a result, the transistor 44 is rapidly switched out of conduction to terminate the output pulse of the waveform 52. Because of the rapid change of state of the circuit in accordance with this invention, the inverted output pulses of the waveform 52 have rapid fall and rise times that may be substantially more rapid than that of the input pulse of the waveform 32. It is to be noted that at the operating point such as 152 the current through the tunnel diode is relatively small but that a substantial amount of current passes through the resistor 58. A relatively large current passes from the lead 42 into the base of the transistor 44. Also at the operating point 150 a small amount of current passes through the resistor 58 partly from the source 38. Thus, by sacrificing current from the source 38 through the resistor 58 much larger transistor leakage currents may be tolerated. However, the combined current through the tunnel diode and through the resistor 58 when the transistor 44 is switched to the conductive condition is substantially less than when utilizing a fixed bias resistor in the conventional arrangement.

In another arrangement for allowing a relatively large leakage current to be tolerated from the switching transistor as shown in FIG. 3, negative trigger pulses of the waveform 72 are combined at the trailing edges of the pulses of the waveform 70 to form the combined pulses of the waveform 98. This negative trigger pulse or spike causes the source 60 to receive a momentary reverse current so that the circuit will change from the conductive to the nonconductive condition. As shown in FIG. 4, a high leakage current may provide operation at a point 162, for example, substantially above the valley point 134 of the composite curve 120. Similar to the discussion relative to FIG. 1 when the pulse 98 is applied to the lead 82, the operating point changes rapidly to the point 126 during formation of the output pulse of the waveform 110. At the termination of the pulse of the waveform 98 the negative potential applied to the anode of the tunnel diode 83 provides a momentary negative incremental current change to cause the operating characteristic of the circuit to shift down to the left on the curve 120 and then rapidly to the off point 162. It is again to be noted that the pulses of the waveform 110 have fast rise times and fall times because of the rapid change of the circuit from one state to another. Thus, in the arrangement of FIG. 3, the leakage current may be substantially larger than the current level at the valley point 134 with the negative trigger pulse allowing the tunnel diode 83 to change state and the transistor 84 to be shifted to the off or nonconductive condition.

The principles in accordance with this invention having been explained relative to their performance in response to switching pulses, the operation will now be explained in response to a varying input potential to develop the characteristics of a Schmitt trigger circuit, that is, a circuit that triggers in one direction when the input potential is raised to a critical value and triggers in the reverse direction when the input potential is reduced to another lower critical value. First considering the circuit of FIG. 1, an input potential of a waveform 166 as shown in FIG. 6 is applied to the resistor 14 at the source 12 when the circuit is at the operating point 122 of FIG. 4, providing a potential rise on the lead 16 as shown by a waveform 167. When the potential applied from the source 12 rises to an upper trigger point 168, the tunnel diode 34 changes state to the operating point 126 of FIG. 4 and the transistor 20 conducts load current to develop a negative output pulse of waveform 170 on the lead 28. Regardless of the rise in potential of the input potential of the waveform 166, as shown by a dotted line, the transistor 20 remains saturated. As the potential of the waveform 166 drops to a lower trigger point 174, the tunnel diode 34 changes state to the point 122. Also, when the circuit is operating at the point 122, regardless to what lower level that the potential of waveform 166 falls, as indicated by a dotted line, the transistor 20 remains biased in the nonconductive state.

Figure 7:
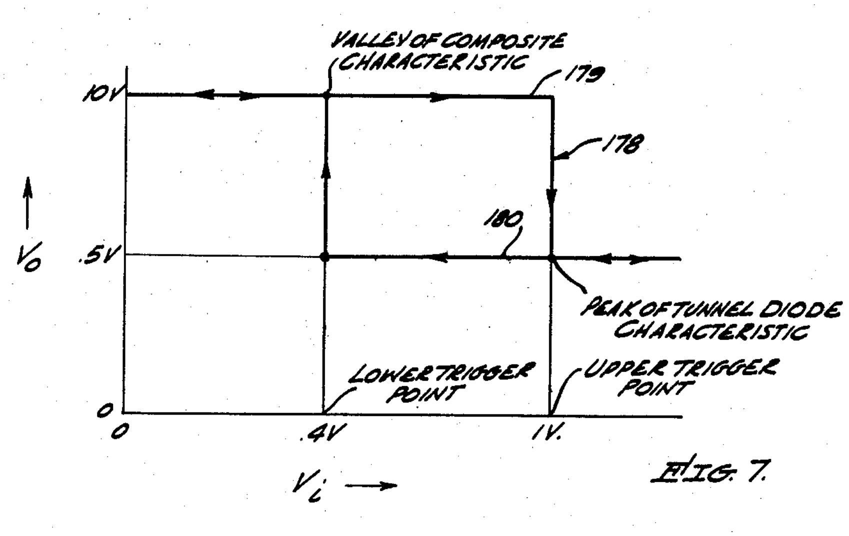
FIG. 7 is a graph of input voltage versus output voltage for further explaining the Schmitt trigger operation of the circuits of FIGS. 1 and 2.

To further illustrate the operation of the circuit of FIG. 1 for developing a Schmitt trigger characteristic, a curve 178 of FIG. 7 shows the two output levels of the pulse 170 in response to the varying potential levels of the waveform 166. When the transistor 20 is nonconductive, the output potential level $V_0$ is high as indicated at 179 and when the transistor 20 is conductive, the output pulse of the waveform 170 indicated at the level 180 is developed. Thus, when the input potential $V_1$ rises to the upper trigger point 168 (FIG. 6) the curve 178 falls to the low voltage level 180 and regardless of variations of input potential remains at that output level until the input potential falls to the lower trigger point 174 (FIG. 6). The circuit then switches to the high output voltage level 179 in which condition the transistor 20 is in the off or nonconductive condition.

The circuit of FIG. 2 providing operation with a relatively large transistor leakage current also has similar Schmitt characteristics as illustrated by FIG. 7. However, as discussed above relative to FIG. 5, the circuit of FIG. 2 switches from the low voltage state to the high voltage state while allowing a relatively large transistor leakage current to flow through the tunnel diode 56. It is to be noted that the hysteresis of the circuit which is the voltage between the lower and upper trigger points may be selected in the circuit of FIG. 2 by varying the value of the parallel resistor 58 so that the valley point 148 of FIG. 5 is at a desired current.

Although the circuits in accordance with this invention have been explained when utilizing n-p-n type transistors, it is to be noted that opposite polarity type transistors may be utilized within the principles of this invention by reversing the polarity relations of the circuit.

Thus, there has been described an improved transistor and tunnel diode circuit that develops controlled current biasing for the transistor. Substantial power is saved from the driving source and the switching transistor has effective zero collector current in the off or nonconductive condition. Because the valley point of tunnel diodes has been found to be relatively low, the circuits in accordance with this invention allowing a relatively large leakage current to be tolerated through the transistor will be highly useful. Also, the circuits in accordance with this invention provide a trigger type operation so as to develop output pulses with steep leading and trailing edges independent of the steepness of the input pulse, and to develop with Schmitt trigger characteristics.

What is claimed is:

1. A circuit for developing output pulses in response to input pulses comprising a first input source for developing input pulses, a second input source coupled to said first source for developing trigger pulses at the termination of each of the input pulses developed by said first source, a source of potential having first and second terminals, a transistor having a base, an emitter and a collector with the base coupled to one terminal of said first input source and the emitter coupled to one end of said first terminal of said source of potential, impedance means coupled between said second terminal of said source of potential and the collector of said transistor, a tunnel diode coupled between the base of said transistor and said first terminal of said source of potential, and first and second mutually coupled inductors with said first inductor coupled between said one terminal of said first input source and the base of said transistor and the second inductor coupled between one terminal of said second source of input signals and said first terminal of said source of potential, said first and second input sources and said first and second mutually coupled inductors being intercoupled so that said input pulse and said trigger pulse are combined to provide a composite waveform having a first portion of one polarity and a second portion of relatively short duration and of opposite polarity from said first portion immediately following said first portion.

2. A switching circuit responsive to input pulses to form output pulses comprising a first input source for developing input pulses, a second input source coupled to said first source for developing a trigger pulse of opposite polarity from said input pulses at the termination of each of said input pulses, a source of positive potential having first and second terminals, a transistor having a base, an emitter and a collector with the emitter coupled to said first terminal of said source of positive potential, a resistor coupled between said second terminal of said source of positive potential and the collector of said transistor, a tunnel diode having an anode and a cathode coupled respectively between the base of said transistor and said first terminal of said source of positive potential, first and second inductive elements inductively coupled with said first inductive element coupled between one terminal of said first input source and the base of said transistor and with said second inductive element coupled between one terminal of said second input source and said first terminal of said source of positive potential, said first and second inductive elements being intercoupled so that said input pulse and said trigger pulse are combined to provide at the base of said transistor a composite waveform having a first portion of one polarity and a second portion of relatively short duration and of opposite polarity from said first portion immediately following said first portion.

References Cited in the file of this patent

UNITED STATES PATENTS

| | | |
|---|---|---|
| 2,843,765 | Aigrain | July 15, 1958 |
| 2,956,175 | Bothwell | Oct. 11, 1960 |
| 2,975,377 | Price | Mar. 14, 1961 |

OTHER REFERENCES

"Hughes Tunnel Diode Application Engineering Notes L–9," May 1960.

Sylvan et al.: "Tunnel Diodes as Amplifiers and Switches." Reprint from May 1960, Issue of Electronic Equipment Engineering; 7 pp.—only pp. 6 and 7.

Neff et al.: Esaki Diode Logic Circuits, 1960, Int. Solid-State Circuits Conf.; pages 16 and 17.